(12) United States Patent
Fujimaki

(10) Patent No.: US 12,424,263 B2
(45) Date of Patent: Sep. 23, 2025

(54) APPARATUSES AND METHODS FOR ARRANGING READ DATA FOR OUTPUT

(71) Applicant: MICRON TECHNOLOGY, INC., Boise, ID (US)

(72) Inventor: Ryo Fujimaki, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 245 days.

(21) Appl. No.: 17/827,582

(22) Filed: May 27, 2022

(65) Prior Publication Data

US 2023/0386556 A1 Nov. 30, 2023

(51) Int. Cl.
*G11C 11/4076* (2006.01)
*G11C 11/4093* (2006.01)
*G11C 11/4096* (2006.01)

(52) U.S. Cl.
CPC ...... *G11C 11/4076* (2013.01); *G11C 11/4093* (2013.01); *G11C 11/4096* (2013.01)

(58) Field of Classification Search
CPC .................................................. G11C 11/4076
See application file for complete search history.

(56) References Cited

U.S. PATENT DOCUMENTS

| | | | | |
|---|---|---|---|---|
| 7,864,084 B2 * | 1/2011 | Padaparambil | ......... | H03M 9/00 341/100 |
| 10,712,770 B1 * | 7/2020 | Chiang | ...................... | G06F 1/10 |
| 2006/0097762 A1 * | 5/2006 | Jeon | ...................... | H03L 7/0805 327/156 |
| 2010/0054059 A1 * | 3/2010 | Yoon | ...................... | G11C 29/028 365/219 |
| 2017/0324540 A1 * | 11/2017 | Jung | ........................ | H04L 25/00 |
| 2021/0335400 A1 * | 10/2021 | Koh | ...................... | G11C 7/1069 |

* cited by examiner

*Primary Examiner* — Douglas King
(74) *Attorney, Agent, or Firm* — Dorsey & Whitney LLP

(57) ABSTRACT

Apparatuses and methods for arranging read data for output are described. An example apparatus includes a clock circuit, a data output circuit, and a control circuit. The clock circuit is configured to provide multiphase clock signals having different phases from each other based on a clock signal. The data output circuit is configured to receive a plurality of read data bits responsive to a read command and serially output each of the plurality of read data bits in synchronism with a corresponding one of the multiphase clock signals. The control circuit is configured to determine the correspondences between the plurality of read data bits and the multiphase clock signals based on information about which of the multiphase clock signals captures the read command.

23 Claims, 10 Drawing Sheets

APPARATUSES AND METHODS FOR ARRANGING READ DATA FOR OUTPUT

BACKGROUND

Semiconductor memories are used in many electronic systems to store data that may be retrieved at a later time. Semiconductor memories are generally controlled by providing the memories with command signals, address signals, and clocks. The command signals may control the semiconductor memories to perform various memory operations, for example, a read operation to retrieve data from a memory, and a write operation to store data to the memory. The memory operations are performed on memory locations identified by the address signals.

Clock circuits included in a semiconductor memory may use the external clocks to generate internal clocks, which are in turn used when performing various operations. The internal clocks that are generated may have a lower clock frequency than the external clocks, which may result in the internal clocks having an in-phase relationship (even clock) with the external clocks or having an out-of-phase relationship (odd clock) with the external clocks.

The internal clocks may be used by some clock circuits to provide multiphase clocks, which may be used, for example, for timing the provision and/or receipt of data by the memory. In providing the multiphase clocks, the clock circuits may lock on the in-phase internal clock or the out-of-phase internal clock. As a result, access operations relying on the internal clocks and/or multiphase clocks may be clocked in-phase or clocked out-of-phase.

Clocking memory operations out-of-phase may result in a semiconductor memory providing read data out of sequence. Swapping in-phase clocks with out-of-phase clocks when memory operations are clocked out-of-phase may resolve the issue with out of sequence read data. However, in order to preserve synchronization of external and internal clocks, the clocks should be swapped synchronously, which is challenging and may result in delayed access times or timing inaccuracies.

DETAILED DESCRIPTION

Various embodiments of the present disclosure will be explained below in detail with reference to the accompanying drawings. The following detailed description refers to the accompanying drawings that show, by way of illustration, specific aspects in which embodiments of the present disclosure may be practiced. These embodiments are described in sufficient detail to enable those skilled in the art to practice the embodiments of present disclosure. Other embodiments may be utilized, and structure, logical and electrical changes may be made without departing from the scope of the present disclosure. The various embodiments disclosed herein are not necessary mutually exclusive, as some disclosed embodiments can be combined with one or more other disclosed embodiments to form new embodiments.

Certain details are set forth below to provide a sufficient understanding of embodiments of the disclosure. However, it will be clear to one skilled in the art that embodiments of the disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring embodiments of the disclosure. Additionally, terms such as "couples" and "coupled" mean that two components may be directly or indirectly electrically coupled. Indirectly coupled may imply that two components are coupled through one or more intermediate components.

Figure 1:
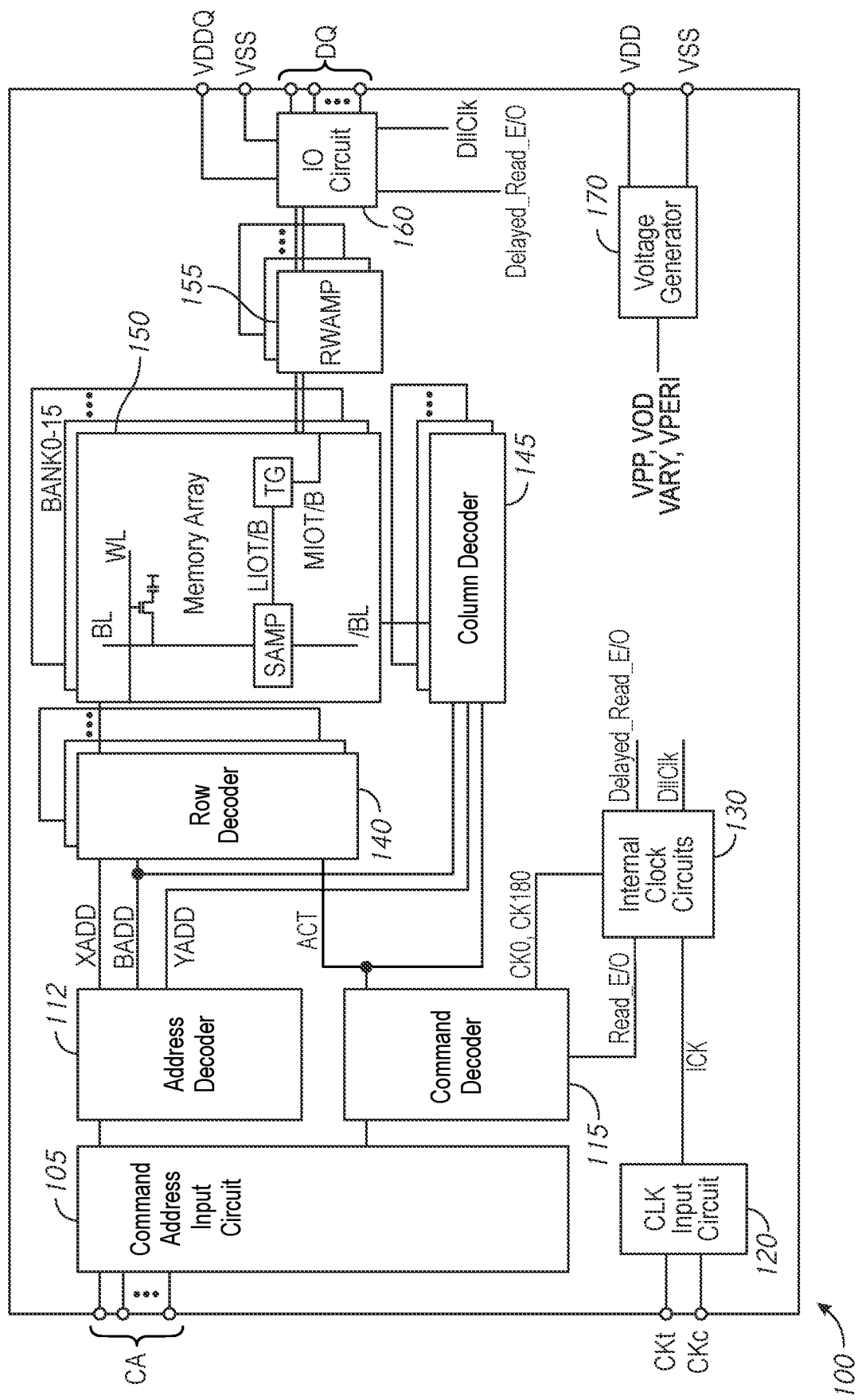
FIG. 1 is a block diagram of a semiconductor device according to an embodiment of the invention.

FIG. 1 is a block diagram of an apparatus according to an embodiment of the disclosure. The apparatus may be a semiconductor device 100, and will be referred as such. In some embodiments, the semiconductor device 100 may include, without limitation, a DRAM device, such as double data rate (DDR) memory integrated into a single semiconductor chip, for example.

The semiconductor device 100 includes a memory array 150. The memory array 150 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL is performed by a row decoder 140 and the selection of the bit line BL is performed by a column decoder 145. Sense amplifiers (SAMP) are coupled to corresponding bit lines BL and /BL. The sense amplifiers are further coupled to at least one respective local I/O line pair (LIOT/B), which is in turn coupled to at least respective one main I/O line pair (MIOT/B), via transfer gates (TG).

The semiconductor device 100 may employ a plurality of external terminals that include command and address terminals coupled to command/address bus to receive command/address signals CA, clock terminals to receive clocks CKt and CKc, data terminals DQ, power supply terminals VDD, VSS, and VDDQ.

The command/address terminals may be supplied with address signals and a bank address signal from outside. The address signals and the bank address signals supplied to the address terminals are transferred, via the command/address input circuit 105, to an address decoder 112. The address decoder 112 receives the address signals and supplies decoded row address signals XADD to the row decoder 140, and decoded column address signals YADD to the column decoder 145. The address decoder 112 also receives the bank address signals and supplies decoded bank address signals BADD to the row decoder 140, the column decoder 145.

The command/address terminals may further be supplied with command signals from outside, such as, for example, a memory controller. The command signals may be transferred, via the command/address input circuit 105, to a command decoder 115. The command decoder 115 receives the command signals and provides internal command signals to perform memory operations, for example, access operations such as a read operation to read data from the memory array 150 and a write operation to write data to the memory array 150. The internal command signals may include, for example, ACT provided to the row and column decoders 140 and 145, and Read E/O provided to an internal clock circuits 130.

When an activate command is received with a row address, and a read command is received with a column address, read data is read from a memory cell in the memory array 150 designated by these row address and column address. The read command is received by the command decoder 115, which provides internal commands so that the read data is output to outside from the data terminals DQ via read/write amplifiers 155 and the input/output circuit 160. The read data is provided at a time defined by read latency information RL that may be programmed in the semiconductor device, for example, in a mode register. The read latency information RL may be defined in terms of clock cycles of the CKt clock. For example, the read latency information RL may be a number of clock cycles of the CKt signal after the read command is received by the semiconductor device 100 when the associated read data is provided at the data terminals DQ.

When an activate command is received with a row address, and a write command is received with a column address, along with write data provided to the data terminals DQ, the write data is written to a memory cell in the memory array 150 designated by these row address and column address. The write command is received by the command decoder 115, which provides internal commands so that the write data is received by data receivers in the input/output circuit 160, and supplied via the input/output circuit 160 and the read/write amplifiers 155 to the memory array 150

The external terminals of the semiconductor device 100 further include clock terminals that are supplied with external clocks and complementary external clocks. The external clocks CKt and CKc may be supplied to a clock input circuit 120. The clock input circuit 120 may receive the external clocks to generate internal clock ICK that are supplied to internal clock circuits 130.

The internal clock circuits 130 includes circuits that provide various phase and frequency controlled internal clocks based on the received internal clock ICK. For example, the internal clock circuits 130 may include a clock path that receives the ICK clock and provides divided clocks CK0 and CK180, and multiphase clocks DllClk. The divided clocks CK0 and CK180 may be provided to clock the command decoder 115, for example, clocking read commands into the command decoder 115, which in turn provides internal read command signals Read_E or Read_O (Read E/O) to the internal clock circuits 130. The internal clock circuits 130 may further provide read command signals Delayed_Read_E/O based on the internal commands Read_E/O and having a same delay as one or more of the multiphase clocks DllClk. The multiphase clocks DllClk and the read command signals Delayed_Read_E/O may be provided to the input/output circuit 160 for controlling an output timing of read data and the input timing of write data. Each of the clocks may also be referred to as a clock signal.

Power supply terminals are supplied with power supply potentials VDD and VSS. These power supply potentials VDD and VSS are supplied to an internal voltage generator circuit 170. The internal voltage generator circuit 170 generates various internal potentials VPP, VOD, VARY, VPERI based on the power supply potentials VDD and VSS. The internal potential VPP is mainly used in the row decoder 140, the internal potentials VOD and VARY are mainly used in the sense amplifiers included in the memory array 150, and the internal potential VPERI is used in many other circuit blocks. A power supply potential VDDQ is also provided to the power supply terminals. The power supply potential VDDQ is supplied to the input/output circuit 160 together with the power supply potential VSS. The power supply potential VDDQ may be the same potential as the power supply potential VDD, but is a dedicated power supply potential used for the input/output circuit 160 so that power supply noise generated by the input/output circuit 160 does not propagate to the other circuit blocks.

Figure 2:
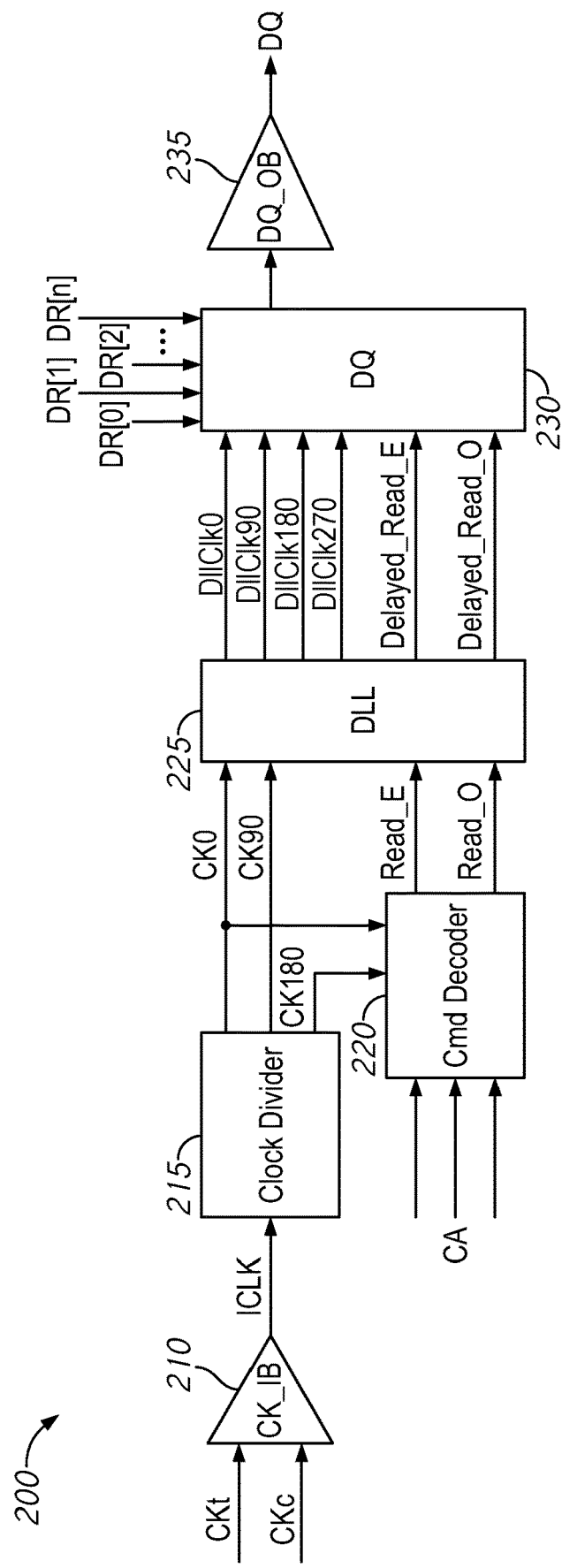
FIG. 2 is a schematic diagram of a read path according to an embodiment of the disclosure.

FIG. 2 is a schematic diagram of a read path 200 according to an embodiment of the disclosure. The read path may be included in the semiconductor device 100 in some embodiments of the disclosure. For example, in some embodiments of the disclosure, a clock input buffer 210 may be included in the clock input circuit 120 of FIG. 1; a clock divider circuit 215 and a clock circuit 225 may be included in the internal clock circuits 130; and/or a data output circuit 230 and data output buffer 235 may be included in the input/output circuit 160.

The read path 200 includes a clock input buffer 210 that receives external clocks CKt and CKc and provides an internal clock ICLK based on the CKt and CKc clocks. The ICLK clock has a same clock frequency as the CKt and CKc clocks. The ICLK clock is provided to a clock divider circuit 215 that provides clocks CK0, CK90, and CK180 based on the ICLK clock. The CK0, CK90, and CK180 clocks have a clock frequency that is one-half the clock frequency of the ICLK clock (and also one-half of the clock frequency of the CKt and CKc clocks). The CK90 clock is 90 degrees out of phase with reference to the CK0 clock and the CK180 clock is 180 degrees out of phase with reference to the CK0 clock. The CK0 clock may be referred to as an "even divided clock" and the CK180 clock may be referred to as an "odd divided clock."

The CK0 and CK180 clocks are provided to a command decoder circuit 220 that receives external command/address signals CA, which are clocked into the command decoder circuit 220 by either the CK0 or CK180 clock. The combination of logic levels of the CA signals may represent different commands for operations that may be performed, for example, a read command to perform a read operation, a write command to perform a write operation, as well as other commands and operations. The command decoder circuit 220 decodes the CA signals to provide internal control signals to perform the operation indicated by the command. For example, when the CA signals indicate a read command, the command decoder circuit 220 decodes the CA signals and provides internal read command signals Read_E or Read_O. The command decoder circuit 220 provides an active Read_E command signal when the CA signals for the read command are clocked into the command decoder circuit 220 based on a rising edge of the CK0 (even divided) clock, and the command decoder circuit 220 provides an active Read_O command signal when the CA signals for the read command are clocked into the command decoder circuit 220 based on a rising edge of the CK180 (odd divided) clock.

A clock circuit 225 is provided one or more of the clocks from the clock divider circuit 215, and is further provided the read command signals Read_E and Read_O from the command decoder circuit 220. In some embodiments of the disclosure, the clock circuit 225 is provided the CK0 and CK90 clocks from the clock divider circuit 215, as shown in the example of FIG. 2.

The clock circuit 225 provides multiphase clocks DllClk0, DllClk90, DllClk180, and DllClk270 based on one or more of the clocks provided by the clock divider circuit 215 (e.g., CK0 clock and/or CK90 clock). The multiphase clocks are provided to a data output circuit 230 which uses the multiphase clocks for timing data operations, for example, serializing parallel read data. The multiphase clocks have a same frequency as the clocks provided by the clock divider circuit 215.

The clock circuit 225 adds delay relative to the CK0 and/or CK90 clocks in providing the multiphase clocks. The delay added by the clock circuit 225 is for synchronizing operations, for example, of a data output circuit 230 to the external clocks CKt and CKc. Additionally, the clock circuit 225 provides the multiphase clocks having fixed phase relationships relative to one another. For example, the multiphase clocks DllClk0, DllClk90, DllClk180, and DllClk270 may be quadrature clocks. That is, the DllClk90 clock is 90 degrees out of phase relative to the DllClk0 clock, the DllClk180 clock is 180 degrees out of phase relative to the DllClk0 clock (and 90 degrees out of phase relative to the DllClk90 clock), and the DllClk270 clock is 270 degrees out of phase relative to the DllClk0 clock (and 90 degrees out of phase relative to the DllClk180 clock). In some embodiments of the disclosure, the clock circuit 225 is a delay locked loop (DLL) circuit.

The clock circuit 225 also provides read command signals Delayed_Read_E and Delayed_Read_O to the data output circuit 230 that are based on the read command signals Read_E and Read_O from the command decoder circuit 220. The clock circuit 225 adds delay relative to the Read_E and Read_O signals in providing the Delayed_Read_E and Delayed_Read_O signals. The amount of delay added to provide the Delayed_Read_E and Delayed_Read_O signals may be based on the amount of delay added by the clock circuit 225 in providing the multiphase clocks. For example, the Read_E/Read_O signals may be delayed by a same amount of delay added by the clock circuit 225 in providing the DllClk0 clock. In this manner, the relative timing between the CK0 clock and the read command signals Read_E and/or Read_O provided by the command decoder 220 may be maintained in the relative timing between the DllClk0 clock and the read command signals Delayed_Read_E and Delayed_Read_O provided by the clock circuit 225.

As previously described, the data output circuit 230 receives the multiphase clocks DllClk0, DllClk90, DllClk180, and DllClk270 and the read command signals Delayed_Read_E and Delayed_Read_O from the clock circuit 225. The data output circuit 230 also receives read data DR[0]-DR[n]. The read data DR[0]-DR[n] may be provided in parallel to the data output circuit 230. The read data DR[0]-DR[n] may be data from a memory array, for example, during a read operation being performed for a read command. In some embodiments of the disclosure, 16 bits of read data are provided in parallel to the data output circuit 230 (e.g., n=15). The read data DR[0]-DR[n] may be provided from the memory array to the data output circuit 230 over a data bus. The read data DR[0]-DR[n] is clocked into the data output circuit 230 and provided in a serial manner to a data output buffer 235 by the multiphase clocks DllClk0, DllClk90, DllClk180, and DllClk270. The data output circuit 230 receives the read data bits DR[0]-DR[n] for a read command and serially provides the read data bits DR[0]-DR[n] in synchronism with a corresponding one of the multiphase clocks. As a result, the read data DR[0]-DR[n] provided to the data output circuit 230 in parallel is converted into a serial bit stream that is provided to the data output buffer 235.

The data output buffer 235 provides the read data DR[0]-DR[n] serially as output data DQ to an external terminal to be received, for example, by a host that provided the CA signals to request a read operation. The bit order of the serially provided data DQ may be based on the arrangement of the read data DR[0]-DR[n] in the data output buffer 235 before the data DQ is output.

FIG. 2 shows a data output circuit 230 and output data buffer 235 for one external data terminal. A respective data output circuit 230 and output data buffer 235 may be included for every additional external data terminal. Some of the circuits shown in FIG. 2, however, may be shared by the data output circuits 230 and output data buffers 235 of the multiple external data terminals. For example, the clock circuit 225 may provide the multiphase clocks DllClk0, DllClk90, DllClk180, and DllClk270 and read command signals Delayed_Read_E and Delayed_Read_O to the data output circuits 230 for the multiple external data terminals. The clock buffer 210, clock divider circuit 215, and command decoder circuit 220 may also be shared among the multiple external data terminals.

As previously described, in some conditions the read data DR[0]-DR[n] may be clocked into the data output circuit 230 by the multiphase clocks DllClk0, DllClk90, DllClk180, and DllClk270 out-of-phase that results in the data bits provided serially to the data output buffer 235 in an out-of-order arrangement.

Figure 3A:
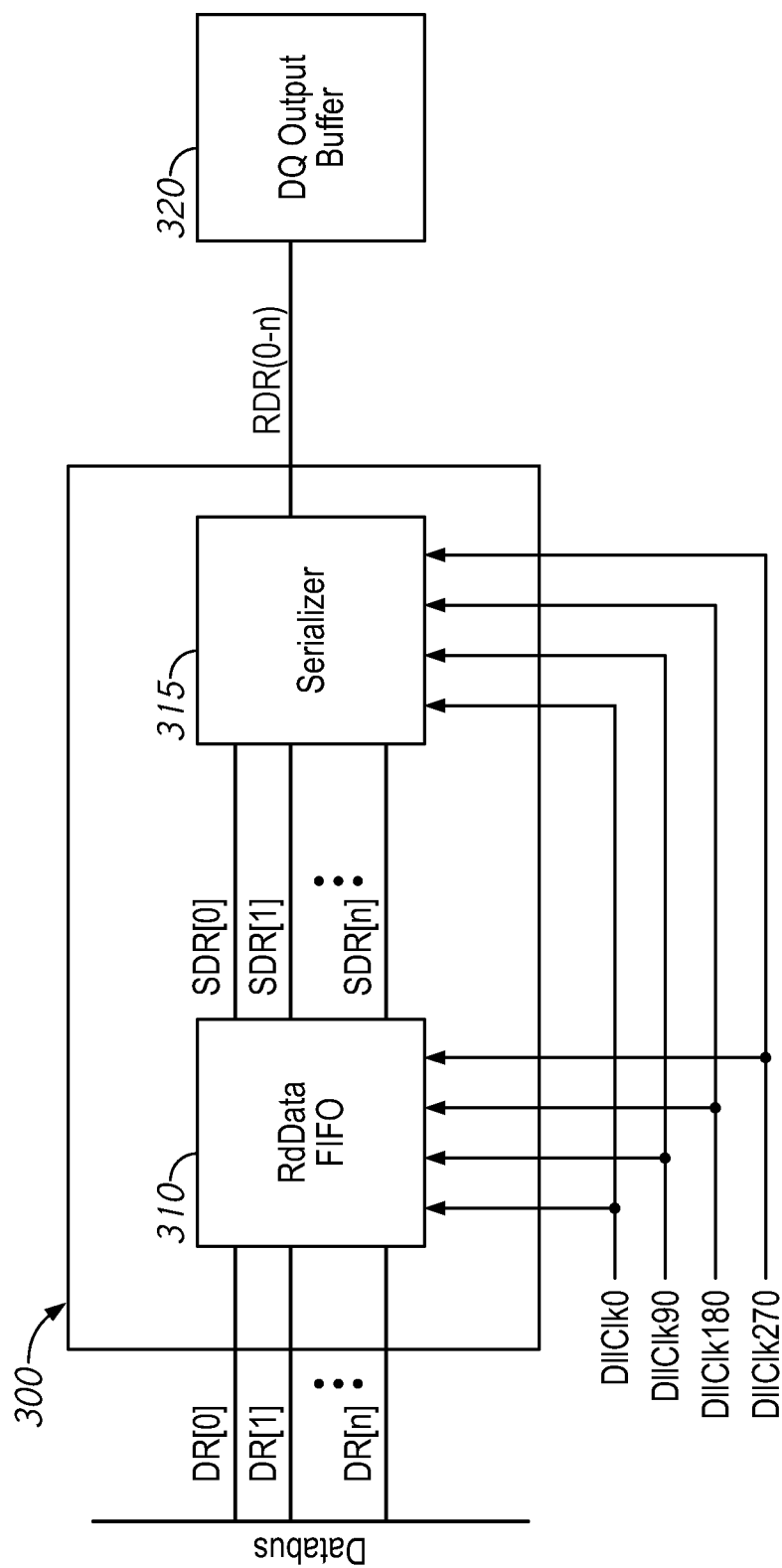
FIG. 3A is a schematic diagram of a portion of a data output circuit according to an embodiment of the disclosure.

FIG. 3A is a schematic diagram of a portion of a data output circuit 300 according to an embodiment of the disclosure. In some embodiments of the disclosure, the data output circuit 300 may be included in the data output circuit 230 of FIG. 2.

The data output circuit 300 includes a data register 310 that receives read data DR[0]-DR[n] in parallel. The read data DR[0]-DR[n] may be provided from a memory array over a data bus. The data register 310 may be arranged as a first-in-first-out (FIFO) register in some embodiments of the disclosure. The read data DR[0]-DR[n] (e.g., alternative notation DR[0:n]) is clocked into the data register 310 based on the multiphase clocks DllClk0, DllClk90, DllClk180, and DllClk270. The data register 310 provides the read data DR[0]-DR[n] as data SDR[0]-SDR[n] in parallel to a serializer circuit 315. The serializer circuit 315 provides the data SDR[0]-SDR[n] from the data register 310 as data RDR(0-n) in a serial manner to a data output buffer 320. As a result, the data SDR[0:n] provided to the serializer 315 in parallel is converted into a serial bit stream that is provided to the data output buffer 320. The serializer circuit 315 receives the multiphase clocks DllClk0, DllClk90, DllClk180, and DllClk270, which are used for timing receipt of the data SDR[0:n] from the data register 310 and for timing the output of the data RDR(0-n) in a serial bit stream.

The data register 310 may rearrange the read data DR[0:n] it receives from the data bus before providing the (rearranged) data SDR[0:n] to the serializer circuit 315. The read data DR[0:n] may be rearranged into an arrangement that when the read data DR[0:n] is provided by the serializer circuit 315 as data RDR(0-n) in serial to the output data buffer 320, the read data DR[0:n] is provided in an expected bit order. Rearranging the read data DR[0:n] may be necessary, for example, when access operations are clocked out-of-phase.

Figure 3B:
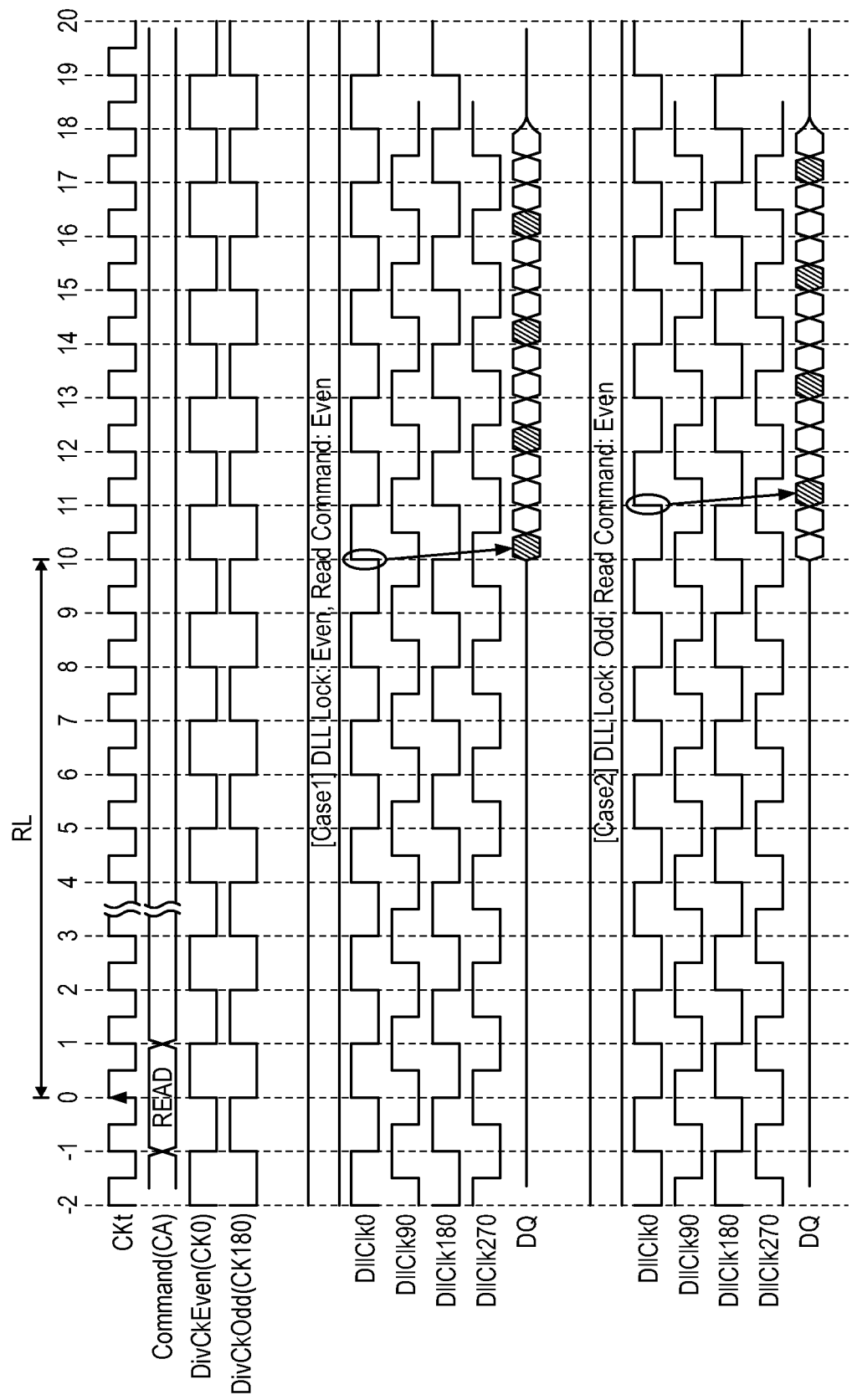
FIG. 3B is a timing diagram showing in-phase clocking of access operations and out-of-phase clocking of access operations.

FIG. 3B is a timing diagram showing in-phase clocking of access operations and out-of-phase clocking of access operations. FIG. 3B shows external clock CKt and a read command READ represented by the command/address signals CA. Even and odd internal clocks DivCkEven (CK0) and DivCkOdd (CK180) are also shown in FIG. 3B. The even and odd clocks DivCkEven and DivCkOdd may be provided, for example, by a clock divider circuit, such as clock divider circuit 215 of FIG. 2, and may correspond or be based on a CK0 clock and CK180 clock, respectively.

FIG. 3B also illustrates multiphase clocks DllClk0, DllClk90, DllClk180, and DllClk270, and output data DQ provided relative to the timing of the multiphase clocks and relative to the timing of external clock CKt, that is, after a read latency (RL) following the READ command. The multiphase clocks DllClk0, DllClk90, DllClk180, and DllClk270 may be provided by a clock circuit, for example, clock circuit 225 of FIG. 2.

As shown for [Case1] where the clocking is in-phase (e.g., the DLL locks on an even clock edge and the READ command is based on an even clock), the RL is measured based on an even clock and a first bit of the output data DQ provided at RL following the READ command corresponds to the DllClk0 clock. As a result, the output data DQ is provided with the first bit corresponding to the DllClk0 clock, a second bit corresponding to the DllClk90 clock, a third bit corresponding to the DllClk180 clock, a fourth bit corresponding to the DllClk270 clock, and so on for the remaining bits of the output data DQ.

In contrast, as shown for [Case2] where the clocking is out-of-phase (e.g., the DLL locks on an odd clock edge and the READ command is based on an even clock), the RL is measured based on an odd clock and a first bit of the output data DQ provided at RL following the READ command corresponds to the DllClk180 clock (and the third bit of the output data DQ corresponds to the DllClk0 clock). As a result, the output data DQ is provided with the first bit corresponding to the DllClk180 clock, a second bit corresponding to the DllClk270 clock, a third bit corresponding to the DllClk0 clock, a fourth bit corresponding to the DllClk90 clock, and so on for the remaining bits of the output data DQ.

Out-of-phase clocking may result when internal operations are based on an out-of-phase clock (e.g., CK180, the odd divided clock) instead of the in-phase clock (e.g., CK0, the even divided clock). For example, out-of-phase clocking may occur when a read command is clocked into a command decoder (e.g., command decoder 220 of FIG. 2) by the odd divided clock, which causes the command decoder to provide an active Read_O command. In another example, out-of-phase clocking may occur when a clock circuit (e.g., clock circuit 225 of FIG. 2) provides the multiphase clocks when locked on an "odd" edge (e.g., falling clock edge) of the CK0 clock, instead of locking on an "even" edge (e.g., rising clock edge) of the CK0 clock. Out-of-phase clocking may also occur when a read latency mode for a read operation is measured from an odd clock edge (e.g., based on CK180 clock instead of based on CK0 clock).

In some embodiments of the disclosure, the data register 310 may additionally rearrange the read data DR[0:n] to support a read burst order feature. The rearranged read data DR[0:n] is then provided by the serializer circuit 315 in an order according to a selected read burst order. The read burst order may be selected, for example, based on one or more of the command signals CA. However, in some embodiments of the disclosure, the data register 310 may rearrange the read data DR[0:n] to correct for out-of-phase clocking, but does not include the read burst order feature.

Figure 4:
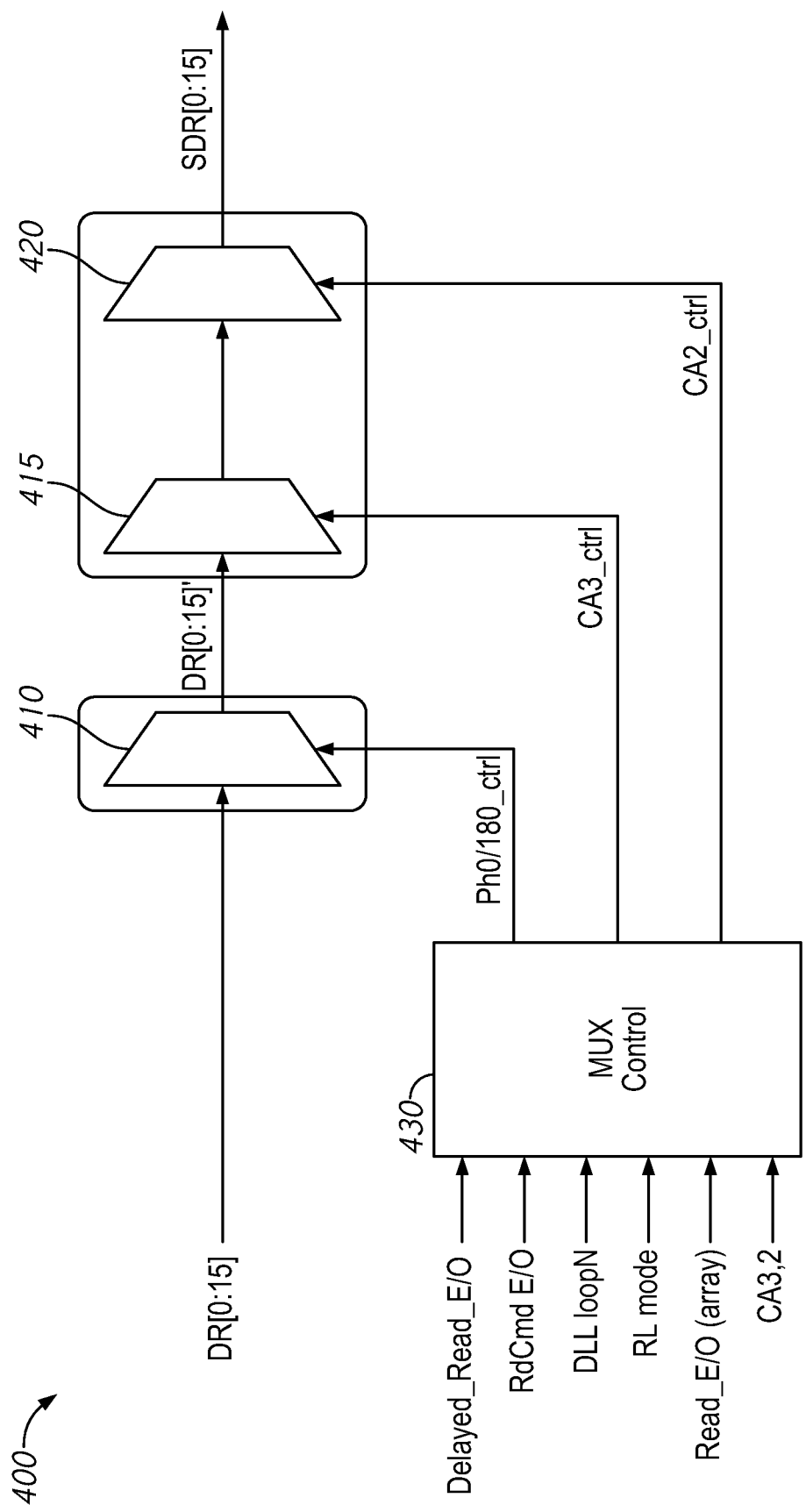
FIG. 4 is a schematic diagram of a portion of a data register according to an embodiment of the disclosure.

FIG. 4 is a schematic diagram of a portion of a data register 400 according to an embodiment of the disclosure. The data register 400 may be included in the data register 310 of FIG. 3 in some embodiments of the disclosure. The data register 400 will be described in the context of n=15, that is, 16 bits of data. However, the data register 400 is not limited to this specific number of data bits.

The data register 400 includes a multiplexer 410, and multiplexers 415 and 420. Read data DR[0:15] is provided in parallel to the multiplexer 410, for example, from a data bus. The multiplexer 410 is controlled by a multiplexer control circuit 430 to provide the read data DR[0:15] as data DR[0:15]' without rearranging the data so that the read data DR[0:15] is provided in-phase (or having an in-phase arrangement), or to provide the read data DR[0:15] as data DR[0:15]' after being rearranged so that the read data DR[0:15] is provided out-of-phase (or having an out-of-phase arrangement). For example, the multiplexer control circuit 430 may control the multiplexer 410 to rearrange the read data DR[0:15] to provide the read data out-of-phase to correct for out-of-phase operation clocking (e.g., clocking based on the odd clock) of the data register, which as previously described, may result in the serializer circuit 315 providing the data DR[0:15] out of order.

The data register 400 further includes multiplexers 415 and 420. Each of the multiplexers 415 and 420 may rearrange the data as controlled by the multiplexer control circuit 430. For example, the multiplexers 415 and 420 may rearrange the data to support a read burst order feature. The read burst order may be controlled, for example, by command signals CA3 and CA2. The data SDR[0:15] resulting from any rearrangement by the multiplexers 410, 415, and 420 is provided by the data register 400 in parallel.

The multiplexer control circuit 430 is provided various signals that control rearrangement of the data DR[0:15] by the multiplexers 410, 415, and 420. The multiplexer control circuit 430 provides a control signal Ph0/180_ctrl to control the multiplexer 410 to rearrange the data DR[0:15] to provide data DR[0:15]'. For example, the multiplexer control circuit 430 is provided with an internal read command signal Delayed_Read_E or Read_O (e.g., provided by a clock circuit, such as clock circuit 225 of FIG. 2), a signal RdCmd E/O indicative of the even/odd state of the read command (e.g., based on Read_E or Read_O; representing information about which of the multiphase clocks DllClk0 or DllClk180 captures the read command), a signal DLL loopN indicative of an even/odd edge to which a clock circuit (e.g., clock circuit 225) locks, and an internal array read command Read_E/O (array) from the memory array corresponding to the internal read command Delayed_Read_E or Read_O. The signal RdCmd E/O and the signal DLL loopN may represent information about the clocking of operations and the multiphase clocks. For example, the signal RdCmd E/O may represent information about which of the multiphase clocks (e.g., CK0 or CK180;

DllClk0 or DllClk180) captures the read command. The multiplexer control circuit 430 may determine a correspondence between the read data bits DR[0:15] and the multiphase clocks DllClk0, DllClk90, DllClk180, and DllClk270 provided to the data register based on information about which of the multiphase clocks DllClk0 or DllClk180 captures the read command (e.g., the signal RdCmd E/O). In some embodiments, an additional signal RL mode is also provided to the multiplexer control circuit 430. The RL mode is indicative of even/odd information about the read latency. However, although shown as being provided to the multiplexer control circuit 430 in FIG. 4, providing the additional signal RL mode is optional, and in some embodiments an RL mode signal is not provided to the multiplexer control circuit 430. The signals may be provided by one or more of the circuits included in the semiconductor device to the multiplexer control circuit 430. For example, the signal RdCmd E/O indicative of the even/odd state of the read command may be provided by a command decoder (e.g., command decoder 115 of FIG. 1) for received read commands. The signal DLL loopN may be provided by the command decoder based on the even/odd edge locked by the clock circuit. The signal RL mode may also be provided by the command decoder based on the even/odd information about the read latency. The internal array read command Read E/O (array) may be provided to the multiplexer control circuit 430 from the memory array after a corresponding internal read command Delayed_Read_E or Read_O propagates through the memory array during an access operation for a read command. Other circuits of the semiconductor device may provide the previously described signals to the multiplexer control circuit 430 as known in the art.

In some embodiments of the disclosure, the RdCmd E/O signal may indicate an even state of the read command (e.g., low logic level) when a read command is clocked into a command decoder circuit based on a rising edge of the CK0 clock (e.g., active Read_E signal; a rising edge of the DllClk0 clock) and may indicate an odd state of the read command (e.g., high logic level) when a read command is clocked into the command decoder circuit based on a rising edge of the CK180 clock (e.g., active Read_O signal; a rising edge of the DllClk180 clock). In some embodiments of the disclosure, the DLL loopN signal may indicate an even edge (e.g., logic low level) when the clock circuit locks on a rising edge of the CK0 clock provided by a clock divider circuit (e.g., clock divider circuit 215) to provide the multiphase clocks DllClk0, DllClk90, DllClk180, and DllClk270. Conversely, the DLL loopN signal may indicate an odd edge (e.g., logic high level) when the clock circuit locks on a falling edge of the CK0 clock to provide the multiphase clocks DllClk0, DllClk90, DllClk180, and DllClk270. In some embodiments of the disclosure, the RL mode signal may indicate even information about the read latency (e.g. low logic level) when the read latency is measured based on rising edges of the CK0 clock, and the RL mode signal may indicate odd information about the read latency (e.g. high logic level) when the read latency is measured based on rising edges of the CK180 clock. For example, in the case the RL is even, the RL mode indicates an even edge when the read command applies on a rising edge of the CK0 clock or an odd edge when the read command applies on a rising edge of the CK180 clock. In the case the RL is odd, the RL mode indicates an even edge when the read command applies on a rising edge of the CK180 clock or an odd edge when the read command applies on a rising edge of the CK0 clock.

In some embodiments of the disclosure, a state (e.g., logic level) of the control signal Ph0/180_ctrl provided by the multiplexer control circuit 430 is based on the even/odd state of the read command (as indicated by the RdCmd E/O signal), the even/odd edge to which a clock circuit locks (as indicated by the DLL loopN signal), and the even/odd information about the read latency (as indicated by the RL mode signal). For example, if any one of the RdCmd E/O signal, DLL loopN signal, or RL mode signal indicate an odd state/information, then the multiplexer control circuit 430 provides the control signal Ph0/180_ctrl to control the multiplexer 410 to rearrange and provide the data DR[0:15] out-of-phase as the data DR[0:15]' (e.g., high logic level Ph0/180_ctrl signal). As a result, the data DR[0:15] is effectively provided out-of-phase. Likewise, if all of the RdCmd E/O signal, DLL loopN signal, and RL mode signal indicate odd state/information, then the multiplexer control circuit 430 provides the control signal Ph0/180_ctrl to control the multiplexer 410 to rearrange and provide the data DR[0:15] out-of-phase as the data DR[0:15]'. For all other combinations of the EVEN/ODD signal, DLLLOCK signal, and RLMODE signal, the multiplexer control circuit 430 provides the control signal Ph0/180_ctrl to control the multiplexer 410 to provide the data DR[0:15] in-phase as the data DR[0:15]' without rearrangement (e.g., low logic level Ph0/180_ctrl signal).

The multiplexer control circuit 430 is further provided command signals CA3 and CA2. The multiplexer control circuit 430 provides control signals CA3_ctrl and CA2_ctrl based on the command signals CA3 and CA2 to control the multiplexers 415 and 420 to rearrange the data DR[0:15]' to provide data SDR[0:15]. The command signals CA3 and CA2 may be used to indicate a read burst order for the data SDR[0:15], as rearranged by the multiplexers 415 and 420. For example, if one or both of the command signals CA3 and CA2 are a high logic level, the data DR[0:15]' is rearranged to provide the data SDR[0:15]. However, if both of the command signals CA3 and CA2 are a low logic level, the data DR[0:15]' is provided as the data SDR[0:15] without rearrangement.

The read burst order feature may be optional, and thus, is not necessarily included with the multiplexer 410. For example, in some embodiments of the disclosure, the multiplexers 415 and 420 are omitted, and the multiplexer control circuit 430 is not provided the command signals CA3 and CA2. The multiplexer 410 provides the data SDR[0:15]. The multiplexer control circuit 430 may control the multiplexer 410 to rearrange data DR[0:15] to correct for out-of-phase clocking in providing the data SDR[0:15].

Figure 5:
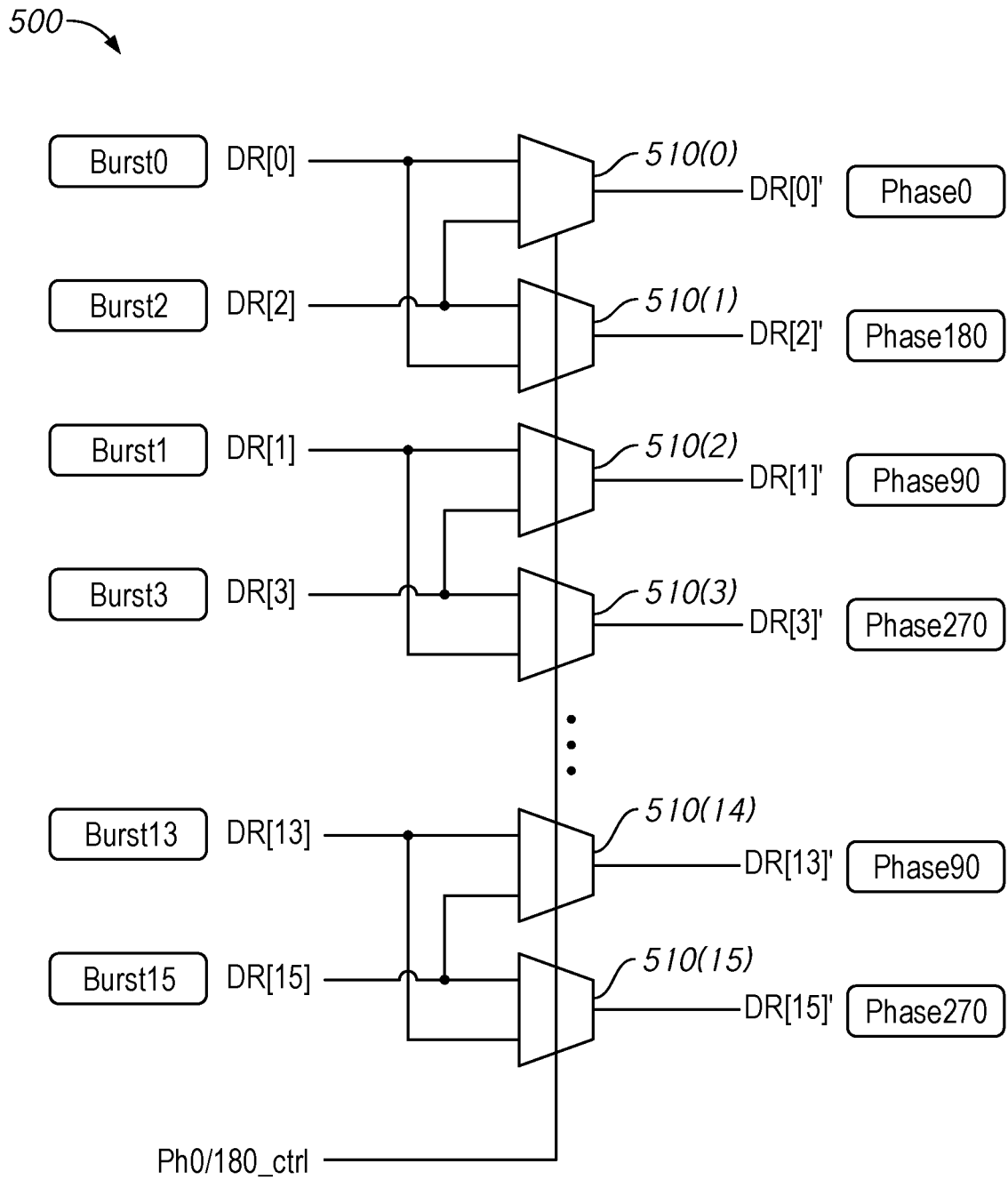
FIG. 5 is a schematic diagram of a multiplexer according to an embodiment of the disclosure.

FIG. 5 is a schematic diagram of a multiplexer 500 according to an embodiment of the disclosure. In some embodiments of the disclosure, the multiplexer 500 is included in the multiplexer 410 of FIG. 4.

The multiplexer 500 includes multiplexer circuits 510(0)-510(15). Each of the multiplexer circuits 510 is provided two bits of the read data DR[0]-DR[15]. For example, the multiplexer circuits 510(0) and 510(1) are provided bits DR[0] and DR[2], the multiplexer circuits 510(2) and 510(3) are provided bits DR[1] and DR[3], the multiplexer circuits 510(4) and 510(5) are provided bits DR[4] and DR[6], and so on, with the multiplexer circuits 510(14) and 510(15) provided bits DR[13] and DR[15]. The multiplexer circuits 510 are also provided a control signal Ph0/180_ctrl to control which of the two bits a multiplexer circuit 510 receives is provided as a respective output.

The multiplexer circuits 510(0)-510(15) may be used to rearrange the bits of the read data DR[0]-DR[15] by swapping data bits before providing the data. For example, each of the multiplexer circuits 510(0)-510(15) provides one of the two bits of the read data as controlled by the control signal Ph0/180_ctrl. The data provided by each of the multiplexer circuits 510(0)-510(15) corresponds to one of four quadrature phases: Phase0, Phase90, Phase180, and Phase 270. Each of the phases may correspond to one of the multiphase clocks DllClk0, DllClk90, DllClk180, and DllClk270. The multiplexer circuits 510(0)-510(15) may be used to provide the bits of data with an in-phase arrangement (e.g., without rearranging the data) or an out-of-phase arrangement (e.g., the data is rearranged). The bits of data may be provided without rearrangement when clocking of operations is in-phase. Rearranging the bits of data to provide the data out-of-phase may correct for out-of-phase clocking of operations. As previously described, out-of-phase clocking may result in the read data DR[0]-DR[15] being serially provided by the serializer circuit out of bit order.

In an example operation when the read data DR[0]-DR[15] is clocked into a data register (e.g., data register 310) in-phase (e.g., DR[0] clocked based on clock DllClk0 and DR[2] clocked based on clock DllClk180), the data DR[0]-DR[15] is not rearranged to provide the data DR[0]'-DR[15]'. For example, the multiplexer circuit 510(0) provides data DR[0] as data DR[0]' corresponding to Phase0, and the multiplexer circuit 510(1) provides data DR[2] as data DR[2]' corresponding to Phase180. Additionally, the multiplexer circuit 510(2) provides data DR[1] as data DR[1]' corresponding to Phase90, and the multiplexer circuit 510(3) provides data DR[3] as data DR[3]' corresponding to Phase270. The remaining data DR[4]-DR[15] is similarly provided by the other multiplexer circuits 510 as data DR[4]'-DR[15]', with multiplexer circuit 510(14) providing data DR[13] as data DR[13]' corresponding to Phase90 and the multiplexer circuit 510(15) providing data DR[15] as data DR[15]' corresponding to Phase270. As a result, the read data DR[0]-DR[15] is not rearranged by the multiplexer circuits 510 and provided in-phase as data DR[0]'-DR[15]'.

However, in an example operation when the read data DR[0]-DR[15] is clocked into a data register (e.g., data register 310) out-of-phase (e.g., DR[0] clocked based on clock DllClk180 and DR[2] clocked based on clock DllClk0), the data DR[0]-DR[15] is rearranged to provide the data DR[0]'-DR[15]'. For example, the multiplexer circuit 510(0) provides data DR[2] as data DR[0]' corresponding to Phase0, and the multiplexer circuit 510(1) provides data DR[0] as data DR[2]' corresponding to Phase180. Additionally, the multiplexer circuit 510(2) provides data DR[3] as data DR[1]' corresponding to Phase90, and the multiplexer circuit 510(3) provides data DR[1] as data DR[3]' corresponding to Phase270. The remaining data DR[4]-DR[15] is similarly provided by the other multiplexer circuits 510, with multiplexer circuit 510(14) providing data DR[15] as data DR[13]' corresponding to Phase90 and the multiplexer circuit 510(15) providing data DR[13] as data DR[15]' corresponding to Phase270. As a result, pairs of data bits of the read data DR[0]-DR[15] are swapped by the multiplexer circuits 510 and provided out-of-phase as data DR[0]'-DR[15]', which may correct for the out-of-phase clocking of the circuits.

More generally, in some embodiments of the disclosure, data DR[4m] and data DR[4m+2] may be swapped, and data DR[4m+1] and data DR[4m+3] may be swapped by the multiplexer circuits 510(0)-510(15), where m is 0, 1, 2, or 3. As a result, the data may be provided having an in-phase arrangement (e.g., data not swapped; DR[0]:Phase0, DR[2]:Phase180, DR[1]:Phase90, DR[3]:Phase270, . . . DR[13]:Phase90, DR[15]:Phase270) or an out-of-phase arrangement (e.g., data swapped; DR[0]:Phase180, DR[2]:Phase0, DR[1]:Phase270, DR[3]:Phase90, . . . DR[13]:Phase270, DR[15]:Phase90) as controlled by the control signal Ph0/180_ctrl.

Figure 6:
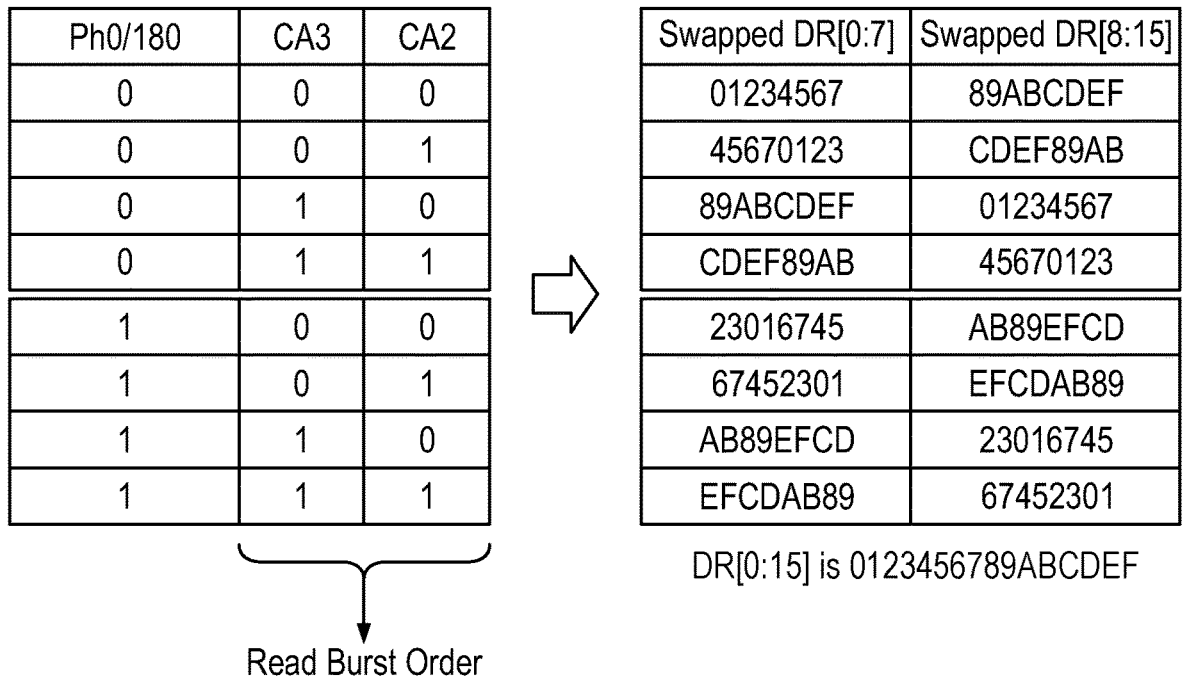
FIG. 6 is a table of conditions and corresponding rearrangement of data according to an embodiment of the disclosure.

FIG. 6 is a table of conditions and corresponding rearrangement of data according to an embodiment of the disclosure. In some embodiments of the disclosure, the table of conditions and rearrangement of data is performed by the portion of the data register 400 of FIG. 4. However, the table of conditions and rearrangement of data of FIG. 6 is not limited to use with only the portion of the data register 400.

In the example of FIG. 6, three conditions are considered in determining a rearrangement of read data DR[0:15] to provide the data SDR[0:15], for example, by the portion of the data register 400. The conditions set by the command signals CA3 and CA2 are related to a read burst order feature that can be used to rearrange the read data DR[0:15] into a desired read burst order. For example, as shown in FIG. 6, when CA3 and CA2 are 1 and 0, respectively, the upper byte of DR[8:15] is swapped with the lower byte of DR[0:7]. As a result, when the Ph0/180_ctrl signal is 0, the data SDR[0:7] is arranged as 89ABCDEF and the data SDR[8:15] is arranged as 01234567; and when the Ph0/180_ctrl signal is 1, the data SDR[0:7] is arranged as AB89EFCD and the data SDR[8:15] is arranged as 23016745.

Figure 7:
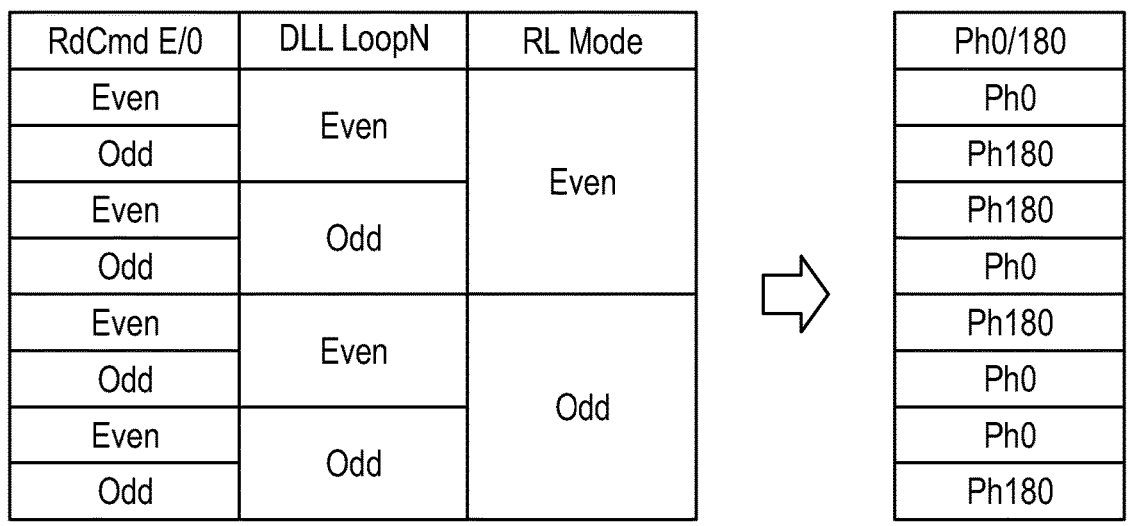
FIG. 7 is a table of conditions and corresponding states for a multiplexer control signal according to an embodiment of the disclosure

The condition set by Ph0/180_ctrl may be based on an even/odd state of the read command, the even/odd edge to which a clock circuit is locked, and an even/odd read latency mode, which were previously described with reference to the portion of the data register 400 of FIG. 4. Based on this information, it can be determined whether read latency will be synchronized with a rising edge of the DllClk0 clock (e.g., Ph0/180_ctrl is 0) or will be synchronized with a rising edge of the DllClk180 clock (Ph0/180_ctrl is 1). For example, FIG. 7 is a table of conditions and corresponding states for Ph0/180_ctrl according to an embodiment of the disclosure. In the example of FIG. 7, the conditions are an even/odd state of the read command (e.g., RdCmd E/O), the even/odd edge to which a clock circuit is locked (e.g., DLL loopN), and even/odd information about read latency (e.g., RL mode).

The various combinations of RdCmd E/O, DLL loopN, and RL mode have corresponding Ph0/180 states as shown in FIG. 7. For example, when RdCmd E/O, DLL loopN, and RL mode are Odd, Odd, and Even, respectively, the corresponding Ph0/180 is Ph0 (e.g., Ph0/180 is 0) to indicate the read latency will be synchronized with a rising edge of the DllClk0 clock. In another example, when RdCmd E/O, DLL loopN, and RL mode are Even, Even, and Odd, respectively, the corresponding Ph0/180 is Ph180 (e.g., Ph0/180 is 1) to indicate the read latency will be synchronized with a rising edge of the DllClk180 clock.

More generally, in the example of FIG. 7, if one of RdCmd E/O, DLL loopN, or RL mode is "Odd," then the corresponding Ph0/180 is Ph180 to indicate the read latency will be synchronized with a rising edge of the DllClk180 clock. Likewise, if all of RdCmd E/O, DLL loopN, and RL mode are "Odd," then the corresponding Ph0/180 is also Ph180. For all other conditions, the corresponding Ph0/180 is Ph0 to indicate the read latency will be synchronized with a rising edge of the DllClk0 clock.

The resulting Ph0/180 may be used in combination with the command signals CA3 and CA2 with the table of conditions and corresponding rearrangement of data of FIG.

6 to determine the arrangement of the data SDR[0:15], as previously described with reference to FIG. 6.

Figure 8:
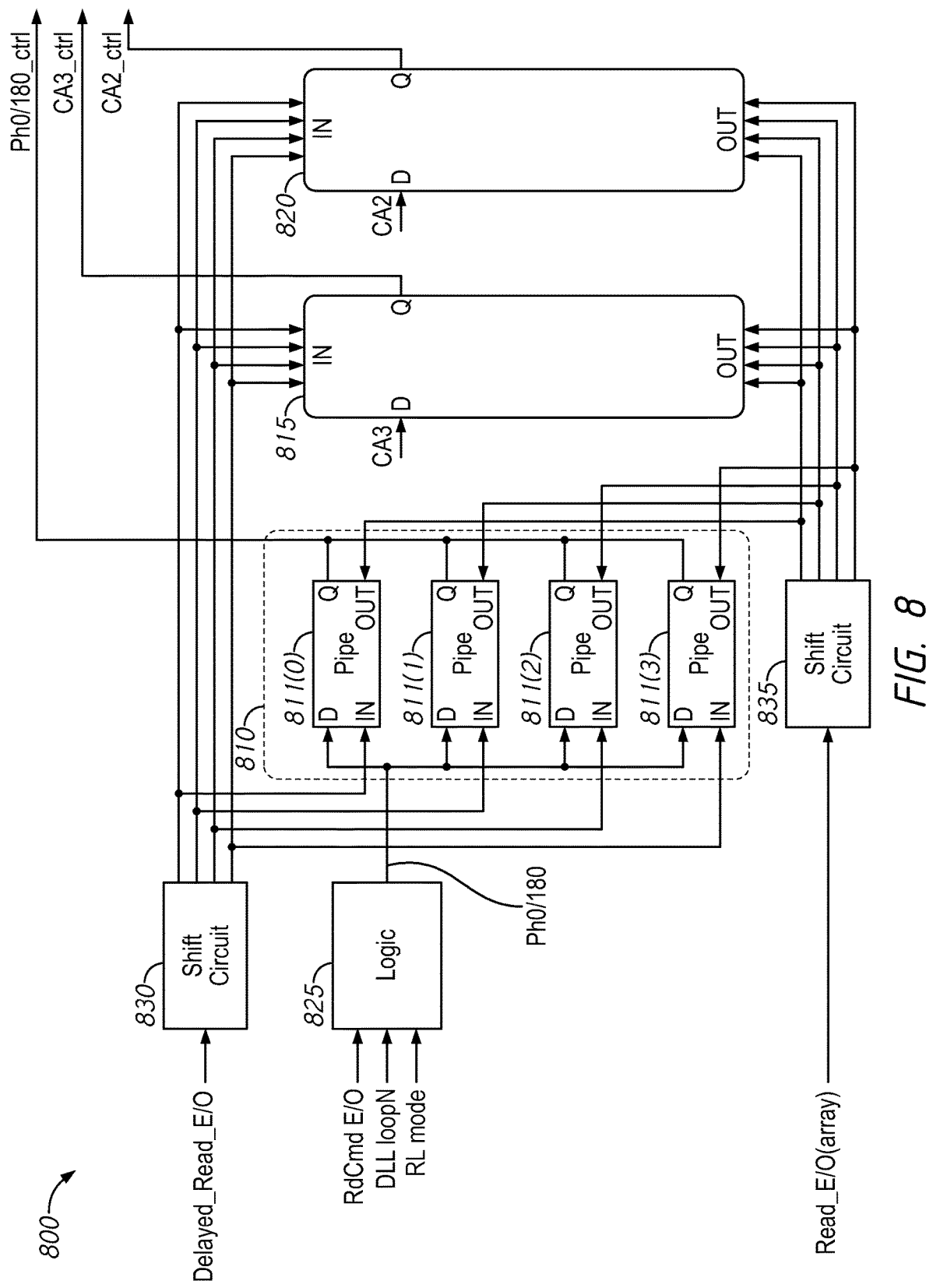
FIG. 8 is a schematic diagram of a multiplexer control circuit according to an embodiment of the disclosure.

FIG. 8 is a schematic diagram of a multiplexer control circuit 800 according to an embodiment of the disclosure. In some embodiments of the disclosure, the multiplexer control circuit 800 is included in the multiplexer control circuit 430.

The multiplexer control circuit 800 includes registers 810, 815, and 820. The multiplexer control circuit 800 further includes control logic circuit 825, and read command shift circuits 830 and 835 that are used to control the registers 810, 815, and 820. The registers 810, 815, and 820 may be arranged as first-in-first-out (FIFO) registers in some embodiments of the disclosure. The register 810 provides the control signal Ph0/180_ctrl having a state (logic level) based on the combined conditions of RdCmd E/O, DLL loopN, or RL mode, that are provided to the control logic circuit 825. The register 815 provides the control signal CA3_ctrl based on the command signal CA3, and the register 820 provides the control signal CA2_ctrl based on the command signal CA2.

The control signals Ph0/180_ctrl, CA3_ctrl, and CA2_ctrl may be provided as multiplexer control signal, for example, to multiplexers 410, 415, and 420 of FIG. 4, respectively. As previously described, the multiplexer 410 may be controlled to rearrange read data DR[0]-DR[n] to provide data DR[0]'-DR[n]'. The read data DR[0]-DR[n] may be rearranged to correct for out-of-phase clocking, as also previously described. The multiplexers 415 and 420 may be controlled to rearrange data to support a read burst order feature.

The control logic circuit 825 is provided control signals representing the respective states of RdCmd E/O, DLL loopN, and RL mode. In some embodiments of the disclosure, the control logic circuit 825 includes logic circuits to provide the control signal Ph0/180 having a state (e.g., logic level) based on the RdCmd E/O, DLL loopN, and RL mode as previously described with reference to FIG. 7. The logic level of the Ph0/180 signal is indicative of an operation clocking, such as, an in-phase clocking or out-of-phase clocking. The resulting control signal Ph0/180 is provided to the register 810. The register 810 is shown in FIG. 8 as including pipe circuits 811(0)-811(3). Each of the pipe circuits 811(0)-811(3) is provided the control signal Ph0/180 from the control logic circuit 825. Additionally, each of the pipe circuits 811(0)-811(3) is provided a respective input pointer signal by the read command shift circuit 830 and is provided a respective output pointer signal by the read command shift circuit 835. A pipe circuit 811 latches a current control signal Ph0/180 provided by the control logic 825 when the respective input pointer signal is active. A pipe circuit 811 provides a latched control signal Ph0/180 as a control signal Ph0/180_ctrl when the respective output pointer signal is active.

The read command shift circuit 830 provides an active input pointer signal when a read command Delayed_Read_E/O is received. The respective input pointer signals provided by the read command shift circuit 830 controls one of the respective pipe circuit 811(0)-811(3) to latch a current control signal Ph0/180 provided by the control logic circuit 825. One of the input pointer signals is active at a given time to cause one of the pipe circuits 811(0)-811(3) to latch the current control signal Ph0/180 (corresponding to a current read command). Afterwards, another one of the input pointer signals is active to cause another one of the pipe circuits 811(0)-811(3) to latch a next control signal Ph0/180 (corresponding to a next read command). The process repeats for a different one of the pipe circuits 811(0)-811(3) for each subsequent read command received by the read command shift circuit 830. As a result, each of the read commands received by the read command shift circuit 830 causes one of the pipe circuits 811(0)-811(3) to latch a state of a corresponding control signal Ph0/180.

The read command shift circuit 835 provides an active output pointer signal when it receives an internal array read command Read E/O (array) from the memory array corresponding to a read command Delayed_Read_E/O (that was received by the read command shift circuit 830). The internal array read command Read E/O (array) received by the read command shift circuit 835 has a delay relative to a corresponding read command Delayed_Read_E/O received by the read command shift circuit 830. The respective output pointer signals provided by the read command shift circuit 835 controls one of the respective pipe circuit 811(0)-811(3) to provide a latched Ph0/180 signal as the Ph0/180_ctrl signal to a multiplexer, for example, multiplexer 410 of FIG. 4. The Ph0/180_ctrl signal may have a same logic level as the Ph0/180 signal, which is indicative of an operation clocking, such as, an in-phase clocking or out-of-phase clocking, as previously described.

One of the output pointer signals is active at a given time to cause one of the pipe circuits 811(0)-811(3) to provide a latched Ph0/180 signal as the Ph0/180_ctrl signal (corresponding to an internal array read command). Afterwards, another one of the output pointer signals is active to cause another one of the pipe circuits 811(0)-811(3) to provide a next latched Ph0-180 signal as the Ph0/180_ctrl signal (corresponding to a next internal array read command). The process repeats for a different one of the pipe circuits 811(0)-811(3) for each subsequent internal array read command Read_E/O (array) received by the read command shift circuit 835. As a result, each of the internal array read commands Read_E/O (array) received by the read command shift circuit 835 causes one of the pipe circuits 811(0)-811(3) to provide a corresponding control signal Ph0/180_ctrl to the multiplexer.

In operation, when a read command Delayed_Read_E/O is received, the read command shift circuit 830 provides an active input pointer signal to cause one of the pipe circuits 811(0)-811(3) to latch a control signal Ph0/180 corresponding to the read command. The corresponding control signal Ph0/180 is based on the even/odd state of the read command (e.g., RdCmd E/O), the even/odd edge to which a clock circuit is locked (e.g., DLL loopN), and even/odd information about read latency (e.g., RL mode). The read command provided to the read command shift circuit 830 is also used to trigger a series of actions to perform a read operation in a memory array, such as activating a memory and reading the data stored by the memory. When the read data for the corresponding read command is ready to be provided to a data output circuit (e.g., data output circuit 300 of FIG. 3), an internal array read command Read E/O (array) corresponding to the read command Delayed_Read_E/O is provided to the read command shift circuit 835. The read command shift circuit 835 provides an active output pointer signal to the pipe circuit 811 that latched the control signal Ph0/180 for the corresponding read command Delayed_Read_E/O. The active output pointer signal causes the corresponding pipe circuit 811 to provide the control signal Ph0/180 as the Ph0/180_ctrl to a multiplexer to control rearrangement of read data DR[0]-DR[15], for example, to correct for out-of-phase clocking of the read data.

For every read command Delayed_Read_E/O received by the read command shift circuit 830, a corresponding control signal Ph0/180 is latched by one of the pipe circuits 811. The latched control signal Ph0/180 is later provided by the pipe circuit 811 as the Ph0/180_ctrl signal when the read data DR[0]-DR[15] for the read command is ready to be received by a data output circuit. The read data DR[0]-DR[15] is ready when an internal array read command Read E/O (array) corresponding to the read command Delayed_Read_E/O is received by the read command shift circuit 835 and causes the read command shift circuit 835 to provide an active output pointer signal to the corresponding pipe circuit 811. For a next read command Delayed_Read_E/O, another pipe circuit 811 latches a corresponding control signal Ph0/180 and later provides the latched control signal Ph0/180 as the Ph0/180_ctrl signal after the read data DR[0]-DR[15] for the read command is ready. The latching of the Ph0/180 signal and providing of the control signals Ph0/180_ctrl for corresponding read commands continues to cycle through the pipe circuits 811(0)-811(3) for the subsequent read commands Delayed_Read_E/O.

In some embodiments of the disclosure, the registers 815 and 820 may also include pipe circuits as previously described for the register 810. In such embodiments, the pipe circuits of the registers 815 and 820 may be operated as previously described for the pipe circuits 811. For the register 815, the command signal CA3 is latched by the pipe circuits based on the input pointer signals provided by the read command shift circuit 830 and then later provided as the control signal CA3_ctrl based on the output pointer signals provided by the read command shift circuit 835. For the register 820, the command signal CA2 is latched by the pipe circuits based on the input pointer signals provided by the read command shift circuit 830 and then later provided as the control signal CA2_ctrl based on the output pointer signals provided by the read command shift circuit 835. As previously described, the command signals CA3 and CA2 (and corresponding control signals CA3_ctrl and CA2_ctrl) may be used to control rearrangement of data for a read burst order feature.

As also previously described, the read burst order feature may be optional. In some embodiments of the disclosure, a multiplexer control does not include the registers 815 and 820, but includes register 810 to provide the control signals Ph0/180_ctrl for read commands.

Figure 9:
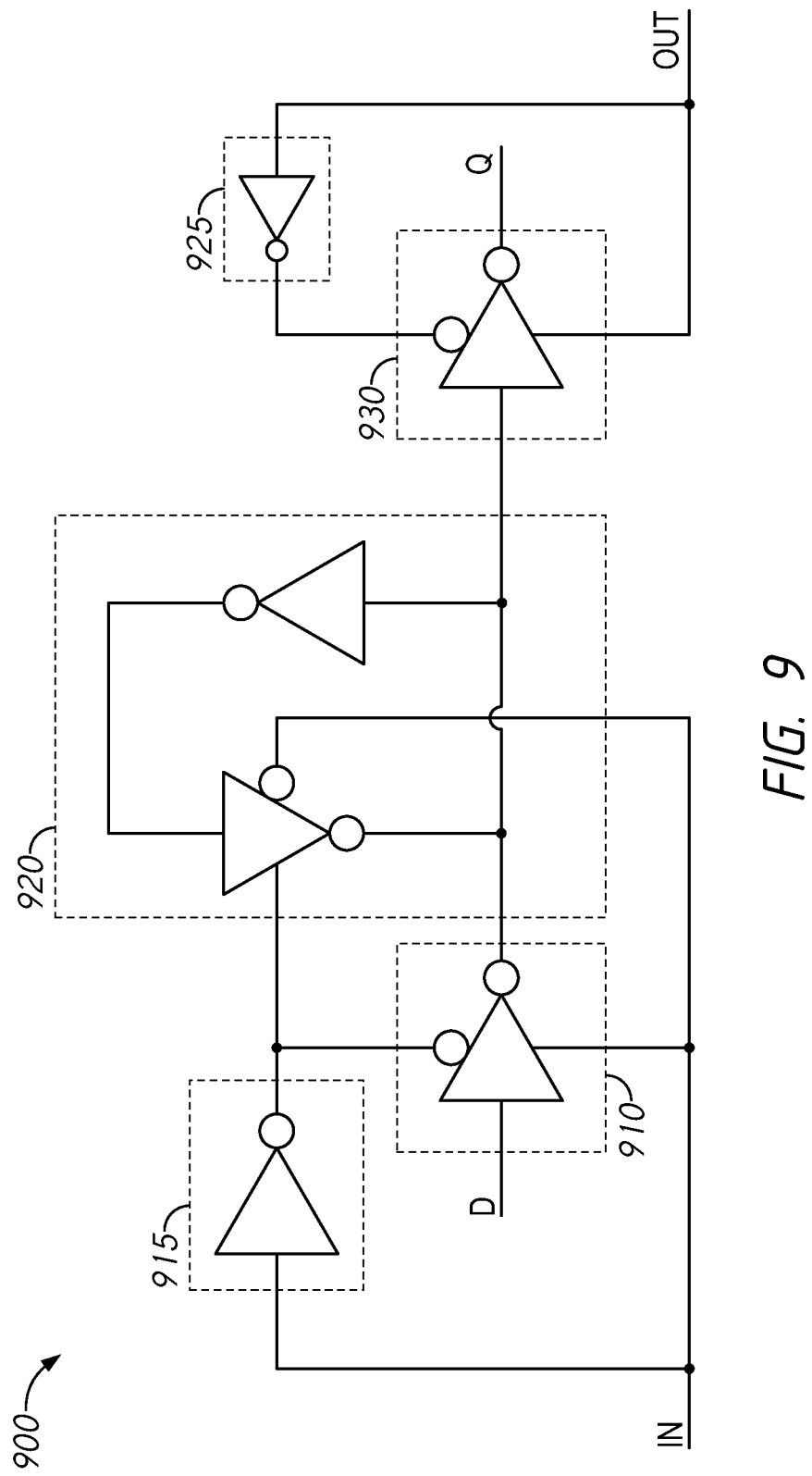
FIG. 9 is a schematic diagram of a pipe circuit according to an embodiment of the disclosure.

FIG. 9 is a schematic diagram of a pipe circuit 900 according to an embodiment of the disclosure. In some embodiments of the disclosure, the pipe circuit 900 may be included in the register 810, 815, and/or 820.

The pipe circuit 900 includes an input circuit 910, a latch circuit 920, and an output circuit 930. Input control circuit 915 and output control circuit 925 are also included in the pipe circuit 900. The input circuit 910 may include an inverter circuit that can be enabled/disabled. When enabled, the inverter circuit provides an output signal that has the complementary logic level of an input signal at an input data node D, and when disabled, the inverter circuit ignores any changes at the input and maintains the logic level of the last output signal. The inverter circuit is enabled by an active signal (e.g., active high logic level) provided to an input control node IN. The output circuit 930 may include an inverter circuit that can be enabled/disabled, and the inverter circuit is enabled by an active signal (e.g., active high logic level) provided to an output control node OUT to provide an output signal at an output data node Q. The latch circuit 920 may include two inverters, one of which can be enabled/disabled. The inverter is enabled by an active signal provided to the input control node IN.

In operation, the complementary logic level of data at the input data node D is provided by the input circuit 910 and latched by the latch circuit 920 when an active input control signal is provided to the input control node IN. The complementary logic level of data provided to the input data node D continues to be latched when the input control signal becomes inactive. When an active output control signal is provided to the output control node OUT, the output circuit 930 is enabled and provides the complementary logic level of the state latched by the latch circuit 920 to the output data node Q. In effect, the output circuit 930 provides at the output data node Q the same logic level of the data provided to the input data node D. Thus, the data provided to the input data node D may be latched when an active input control signal is provided to the input control node IN, and then provided at the output data node Q when an active output control signal is provided to the output control node OUT.

Figure 10:
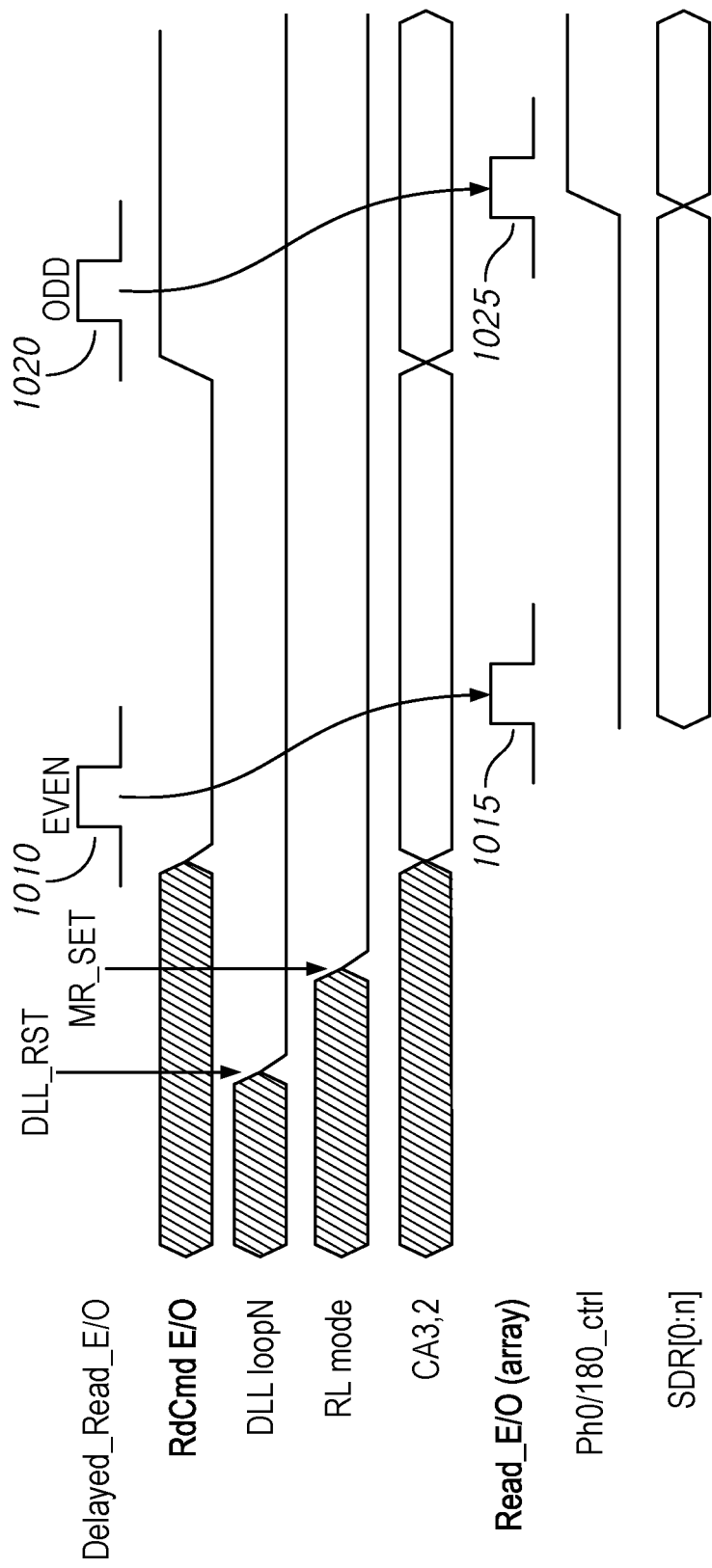
FIG. 10 is a timing diagram showing various signals during operation of a data register according to an embodiment of the disclosure.

FIG. 10 is a timing diagram showing various signals during operation of a data register according to an embodiment of the disclosure. In some embodiments of the disclosure, the example operation of FIG. 10 may be for the data register 400. However, the example operation of FIG. 10 is not limited to the particular data register 400. Similarly, operation of the data register 400 is not limited to the example operation of FIG. 10.

The timing diagram of FIG. 10 includes internal read command Delayed_Read_E/O and corresponding internal array read commands Read_E/O (array). FIG. 10 also shows an even/odd state of the read command (e.g., RdCmd E/O signal), the even/odd edge to which a clock circuit is locked (e.g., DLL loopN signal), and even/odd information about read latency (e.g., RL mode signal). A resulting control signal Ph0/180_ctrl based on the states of the RdCmd_E/O, DLL loopN and RL mode signals is also shown. Output data DQ corresponding to the read commands Delayed_Read_E/O is shown as well. Command signals CA3 and CA2, for a read burst order feature (when available) are also included in FIG. 10.

The DLL loopN signal may be set following a reset of the clock circuit (DLL_RST) based on an initialization sequence and resulting locking to an even/odd clock edge. The RL mode signal may be set based on a mode register setting (MR SET) to have the timing of output data relative to a corresponding read command based on an even or odd clock. A first read command clocked on a rising edge of an even clock (e.g., CK0) results in an even internal read command Delayed_Read_E 1010 and a low logic level RdCmd E/O signal indicating an even state of the read command. As previously described, the RdCmd E/O, DLL loopN, and RL mode signals may be provided to a control logic circuit (e.g., control logic circuit 825). The control logic circuit provides a low logic level Ph0/180 signal based on the low RdCmd E/O signal, low DLL loopN signal, and the low RL mode signal (e.g., with reference to FIG. 7, RdCmd E/O even, DLL loopN even, and RL mode even resulting in Ph0, low logic level). The low logic level Ph0/180 signal is latched by one of the pipe circuits clocked by a respective active read command Delayed_Read_E 1010. When an active internal array read command Read_E (array) 1015 corresponding to the read command Delayed_Read_E 1010 is provided to the corresponding pipe circuit, the latched low logic level Ph0/180 signal is provided as a low logic level Ph0/180_ctrl signal, for example, to control a multiplexer to provide the read data as data SDR[0:n] in-phase. The read data may be rearranged according to a read burst order set by the command signals CA3 and CA2.

As further shown in FIG. 10, a second read command clocked on a rising edge of an odd clock (e.g., CK180) results in an odd internal read command Delayed_Read_O 1020 and a high logic level RdCmd E/O signal indicating an odd state of the read command. Based on the states of the RdCmd E/O, DLL loopN, and RL mode signals, the control logic circuit provides a high logic level Ph0/180 signal (e.g., with reference to FIG. 7, RdCmd E/O odd, DLL loopN even, and RL mode even, resulting in Ph180, high logic level). The high logic level Ph0/180 signal is latched by one of the pipe circuits clocked by a respective active read command Delayed_Read_O 1020. When an active internal array read command Read_E/O (array) 1025 corresponding to the read command Delayed_Read_O 1020 is provided to the corresponding pipe circuit, the latched high logic level Ph0/180 signal is provided as a high logic level Ph0/180_ctrl signal to the multiplexer to provide the read data as data SDR[0:n] out-of-phase. Additionally, the read data may also be rearranged according to a read burst order set by the command signals CA3 and CA2.

Although various embodiments of the disclosure have been disclosed, it will be understood by those skilled in the art that the embodiments extend beyond the specifically disclosed embodiments to other alternative embodiments and/or uses and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying mode of the disclosed embodiments. Thus, it is intended that the scope of at least some of the present disclosure should not be limited by the particular disclosed embodiments described above.

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:

1. An apparatus, comprising:
a clock circuit configured to provide multiphase clock signals having different phases from each other based on a clock signal;
a data output circuit configured to receive the multiphase clock signals and a plurality of read data bits responsive to a read command, the data output circuit comprising:
a data register configured to receive the multiphase clock signals and the plurality of read data bits, the plurality of read data bits clocked into the data register in parallel based on the multiphase clock signals; and
a serializer circuit configured to receive the plurality of read data bits from the data register in parallel and further receive the multiphase clock signals, each of the plurality of read data bits output serially from the serializer circuit in synchronism with a corresponding one of the multiphase clock signals; and
a control circuit configured to determine the correspondences between the plurality of read data bits and the multiphase clock signals based on information about which of the multiphase clock signals captures the read command.

2. The apparatus of claim 1 wherein the control circuit is further configured to determine the correspondences between the plurality of read data bits and the multiphase clock signals based additionally on information about a clock edge to which the clock circuit locked to provide the multiphase clock signals.

3. The apparatus of claim 2 wherein the control circuit is further configured to determine the correspondences between the plurality of read data bits and the multiphase clock signals based additionally on even or odd information about read latency for the read command.

4. The apparatus of claim 3 wherein the control circuit is further configured to provide a control signal having a first logic level based on at least one indicating an odd state:
information about which of the multiphase clock signals captures the read command;
information about the clock edge to which the clock circuit locked; or
the even or odd information about read latency for the read command.

5. The apparatus of claim 4 wherein the control: circuit provides the control signal having a second logic level based on all not indicating the odd state:
the information about which of the multiphase clock signals captures the read command;
the information about the clock edge to which the clock circuit locked; and
the even or odd information about read latency for the read command.

6. An apparatus, comprising:
a data output circuit configured to receive read data for a read command based on multiphase clocks, the data output circuit configured to arrange the read data to be in-phase if clocking is in-phase and the data output circuit further configured to arrange the read data to be out-of-phase if clocking is out-of-phase, the data output circuit further configured to provide the read data serially in a bit order based at least in part on the arrangement of the read data, wherein the data output circuit comprises a data register comprising:
a multiplexer configured to receive the read data in parallel and provide the read data in-phase or out-of-phase based on a multiplexer control signal, and
a multiplexer control circuit configured to provide the multiplexer control signal to the multiplexer, the multiplexer control signal having a logic level based at least on an even/odd state of the read command; and
a data output buffer configured to receive the read data from the data output circuit and serially provide the read data.

7. The apparatus of claim 6 wherein:
the data register is configured to receive the read data for the read command in parallel and provide the read data according to a first arrangement if clocking is in-phase and provide the read data according to a second arrangement if clocking is out-of-phase; and
the data output circuit further comprises a serializer circuit configured to receive the read data from the data register and provide the read data in a serial bit stream to the data output buffer.

8. The apparatus of claim 6, further comprising a clock divider circuit configured to receive an internal clock to provide an even clock and an odd clock having clock frequencies less than the internal clock, the even clock having rising clock edges aligned with even cycles of the internal clock and the odd clock having rising clock edges aligned with odd cycles of the internal clock.

9. The apparatus of claim 6 wherein the data output circuit is further configured to provide the read data according to a read burst order based on at least one command signal.

10. The apparatus of claim 6 wherein the data output circuit is configured to determine even or odd clocking of operations based on an even/odd state of the read command and the even/odd edge to which a clock circuit providing the multiphase clocks is locked.

11. The apparatus of claim 6 wherein the multiphase clocks include a phase 0 clock, phase 90 clock, phase 180 clock, and phase 270 clock, and the data output circuit is configured to provide the read data out-of-phase by swapping bits of the read data corresponding to the phase 0 and phase 180 clocks and swapping the bits of the read data corresponding to the phase 90 and phase 270 clocks.

12. An apparatus, comprising:
a data register configured to receive multiphase clocks and further receive read data for a read command in parallel and provide the read data in parallel and having an in-phase or out-of-phase arrangement based on in-phase or out-of-phase clocking of operations, respectively, wherein the read data is clocked into the data register based on the multiphase clock signals;
a serializer circuit configured to receive the read data in parallel from the data register and further receive the multiphase clocks and convert the read data into a serial bit stream that is output from the serializer circuit in synchronism with a corresponding one of the multiphase clocks; and
a data output buffer configured to receive the serial bit stream read data and provide the read data serially.

13. The apparatus of claim 12 wherein the data register comprises:
a multiplexer configured to receive the read data in parallel and provide the read data in the in-phase or out-of-phase arrangement based on a multiplexer control signal; and
a multiplexer control circuit configured to provide the multiplexer control signal to the multiplexer, the multiplexer control signal having a logic level based on an even/odd state of the read command, an even/odd edge to which a clock circuit providing the multiphase clocks is locked, and an even/odd read latency mode.

14. The apparatus of claim 13 wherein the data register further comprises a second multiplexer and a third multiplexer, the second and third multiplexers configured to provide read data from the multiplexer in a read burst order based on a second multiplexer control signal provided to the second multiplexer and a third multiplexer control signal provided to the third multiplexer, wherein the multiplexer control circuit provides the second multiplexer control signal based on a first command signal and provides the third multiplexer control signal based on a second command signal.

15. The apparatus of claim 13 wherein the multiplexer comprises a plurality of multiplexer circuits, each two multiplexer circuits of the plurality of multiplexer circuits configured to receive a same two bits of the read data and swap the two bits of data if the multiplexer control signal has a first logic level and not swap the two bits of data if the multiplexer control signal has a second logic level.

16. The apparatus of claim 13 wherein the multiplexer control circuit comprises:

a control logic circuit configured to provide a control signal having a logic level indicative of operation clocking that is based on the even/odd state of the read command, the even/odd edge to which a clock circuit providing the multiphase clocks is locked, and the even/odd read latency mode;
a plurality of pipe circuits coupled to receive the control signal from the control logic circuit;
a first read command shift circuit configured to receive the read command and provide an active input pointer signal to control one of the plurality of pipe circuits to latch a logic level of the control signal from the control logic circuit; and
a second read command shift circuit configured to receive an array read command corresponding to the read command and provide an active output pointer signal to control the one of the plurality of pipe circuits to provide the control signal to the multiplexer as the multiplexer control signal.

17. The apparatus of claim 12 wherein the read data comprises bits DR[0:15] and the data output buffer is configured to provide the read data having the out-of-phase arrangement by swapping bits of the read data, wherein the bits DR[4m] and data DR[4m+2] are swapped, and data DR[4m+1] and data DR[4m+3] are swapped by the data output buffer, where m is 0, 1, 2, or 3.

18. The apparatus of claim 12 wherein the in-phase clocking of operations is based on an in-phase clock and the out-of-phase clocking of operations is based on a clock 180 degrees out of phase to the in-phase clock.

19. An apparatus, comprising:
a data register configured to receive multiphase clocks and further receive read data for a read command in parallel and provide the read data in parallel and having an in-phase or out-of-phase arrangement based on in-phase or out-of-phase clocking of operations, respectively;
a serializer circuit configured to receive the read data in parallel from the data register and convert the read data into a serial bit stream; and
a data output buffer configured to receive the serial bit stream read data and provide the read data serially,
wherein the data register comprises:
a multiplexer configured to receive the read data in parallel and provide the read data in the in-phase or out-of-phase arrangement based on a multiplexer control signal; and
a multiplexer control circuit configured to provide the multiplexer control signal to the multiplexer, the multiplexer control signal having a logic level based on an even/odd state of the read command, an even/odd edge to which a clock circuit providing the multiphase clocks is locked, and an even/odd read latency mode.

20. The apparatus of claim 19 wherein the data register further comprises a second multiplexer and a third multiplexer, the second and third multiplexers configured to provide read data from the multiplexer in a read burst order based on a second multiplexer control signal provided to the second multiplexer and a third multiplexer control signal provided to the third multiplexer, wherein the multiplexer control circuit provides the second multiplexer control signal based on a first command signal and provides the third multiplexer control signal based on a second command signal.

21. The apparatus of claim 19 wherein the multiplexer comprises a plurality of multiplexer circuits, each two multiplexer circuits of the plurality of multiplexer circuits configured to receive a same two bits of the read data and swap the two bits of data if the multiplexer control signal has a first logic level and not swap the two bits of data if the multiplexer control signal has a second logic level.

22. The apparatus of claim 19 wherein the multiplexer control circuit comprises:
- a control logic circuit configured to provide a control signal having a logic level indicative of operation clocking that is based on the even/odd state of the read command, the even/odd edge to which a clock circuit providing the multiphase clocks is locked, and the even/odd read latency mode;
- a plurality of pipe circuits coupled to receive the control signal from the control logic circuit;
- a first read command shift circuit configured to receive the read command and provide an active input pointer signal to control one of the plurality of pipe circuits to latch a logic level of the control signal from the control logic circuit; and
- a second read command shift circuit configured to receive an array read command corresponding to the read command and provide an active output pointer signal to control the one of the plurality of pipe circuits to provide the control signal to the multiplexer as the multiplexer control signal.

23. An apparatus, comprising:
- a data register configured to receive multiphase clocks and further receive read data for a read command in parallel and provide the read data in parallel and having an in-phase or out-of-phase arrangement based on in-phase or out-of-phase clocking of operations, respectively;
- a serializer circuit configured to receive the read data in parallel from the data register and convert the read data into a serial bit stream; and
- a data output buffer configured to receive the serial bit stream read data and provide the read data serially,
- wherein the read data comprises bits DR[0:15] and the data output buffer is configured to provide the read data having the out-of-phase arrangement by swapping bits of the read data, wherein the bits DR[4m] and data DR[4m+2] are swapped, and data DR[4m+1] and data DR[4m+3] are swapped by the data output buffer, where m is 0, 1, 2, or 3.

* * * * *